United States Patent
Ichinose et al.

(10) Patent No.: US 6,887,967 B2
(45) Date of Patent: May 3, 2005

(54) THERMOSETTING POLYIMIDE RESIN COMPOSITION PROCESS FOR PRODUCING POLYIMIDE RESIN, AND POLYIMIDE RESIN

(75) Inventors: Eiju Ichinose, Chiba (JP); Yohzoh Yamashina, Ichihara (JP); Hidenobu Ishikawa, Ichihara (JP)

(73) Assignee: Dainippon Ink and Chemicals, Inc., Tokyo (JP)

(*) Notice: Subject to any disclaimer, the term of this patent is extended or adjusted under 35 U.S.C. 154(b) by 27 days.

(21) Appl. No.: 10/349,078

(22) Filed: Jan. 23, 2003

(65) Prior Publication Data

US 2003/0149222 A1 Aug. 7, 2003

(30) Foreign Application Priority Data

Jan. 31, 2002 (JP) ........................ 2002-023626

(51) Int. Cl.$^7$ ................ C08G 73/10; C08G 59/42; C08L 79/08
(52) U.S. Cl. ................ 528/170; 528/44; 528/45; 528/65; 528/71; 528/86; 528/101; 528/172; 528/173; 528/176; 528/179; 528/183; 528/188; 528/220; 528/229; 528/310; 528/322; 528/353; 525/420; 525/422; 525/425; 525/428; 525/430; 525/523
(58) Field of Search ................ 528/170, 353, 528/45, 75, 101, 44, 65, 71, 86, 172–173, 176, 179, 183, 188, 220, 229, 310, 322; 525/420, 422, 523, 425, 428, 430

(56) References Cited

U.S. PATENT DOCUMENTS 6,162,889 A * 12/2000 Orikabe et al. ............ 528/75
6,335,417 B1 * 1/2002 Orikabe et al. ............ 528/170
6,784,275 B2 * 8/2004 Ichinose et al. ............ 528/170
2003/0187154 A1 * 10/2003 Schoenfeld et al. ........ 525/523

FOREIGN PATENT DOCUMENTS

| DE | 10017784 A1 | 10/2001 |
|---|---|---|
| EP | 1048680 A1 | 11/2000 |
| JP | 55-137161 | 10/1980 |
| JP | 2001-316469 | 11/2001 |

OTHER PUBLICATIONS

Sendijarevic et al; "Synthesis and Properties of Urethane–Modified Polyimides"; Journal of Polymer Science Part A: Polymer Chemistry Edition 28 (1990) Dec.; No. 13, pp 3603–15.
European Search Report dated Mar. 13, 2003.

* cited by examiner

Primary Examiner—P. Hampton Hightower
(74) Attorney, Agent, or Firm—Armstrong, Kratz, Quintos, Hanson & Brooks, LLP

(57) ABSTRACT

A thermosetting polyimide resin composition is provided which comprises a polyimide resin and an epoxy resin, which has excellent heat resistance, low dielectric constant and low dielectric loss tangent and also yields a cured article having good mechanical properties such as tensile strength and tensile elongation. Also, a process for producing a polyimide resin used in the polyimide resin composition is provided. The thermosetting polyimide resin composition comprises a polyimide resin (X), which has a carboxyl group and a linear hydrocarbon structure having a number-average molecular weight of 300 to 6,000, and an epoxy resin (Y). The polyimide resin is obtained by reacting a prepolymer (A) having an isocyanate group at the end, which is obtained by reacting a polyisocyanate compound (a1) with a polyol compound (a2) having a linear hydrocarbon structure in which a number-average molecular weight of a linear hydrocarbon structure is from 300 to 6,000, with an anhydride (B) of polycarboxylic acid having three or more carboxyl groups in an organic solvent.

20 Claims, No Drawings

US 6,887,967 B2

THERMOSETTING POLYIMIDE RESIN COMPOSITION PROCESS FOR PRODUCING POLYIMIDE RESIN, AND POLYIMIDE RESIN

BACKGROUND OF THE INVENTION

1. Field of the Invention

The present invention relates to a thermosetting polyimide resin composition which is useful in the fields of various heat-resistant coating materials and electrical insulating materials, for example, layer insulating materials of printed circuit boards, build-up materials, insulating materials of semiconductors, and heat-resistant adhesives, and a process for producing a polyimide resin, which is applicable for the thermosetting polyimide resin composition.

2. Description of Related Art

It has recently been required to improve heat resistance and electrical characteristics of resins in various fields, particularly in the electrical and electronics industries. As a resin composition having improved heat resistance, there is known a polyimideamide resin composition comprising a polyamideimide resin obtained by synthesizing an isocyanurate ring-containing polyisocyanate, an aromatic isocyanate and a polycarboxylic acid containing lactam and an acid anhydride in a cresol solvent, and an epoxy resin (see, for example, Japanese Patent Unexamined Application, First Publication No. Sho 55-137161 (pages 2–5)).

Also, there is known a process for producing a polyimide resin which is soluble in a general-purpose solvent, for example, aprotic polar organic solvent such as ketone solvent, ester solvent or ether solvent, excluding a solvent having strong odor and strong toxicity such as cresol, for example, a polyimide resin obtained by reacting an aliphatic isocyanate compound and/or an alicyclic isocyanate compound, which have two or more isocyanate groups in the molecule, with a tricarboxylic anhydride and/or a tetracarboxylic anhydride, and a polyimide resin composition comprising the polyimide resin and the epoxy resin (see, for example, Japanese Unexamined Patent Application, First Publication No. 2001-316469 (pages 3–9).

However, cured articles obtained by curing the polyimide resin composition comprising a polyimide resin and an epoxy resin described in Japanese Unexamined Patent Application, First Publication No. Sho 55-137161 and Japanese Unexamined Patent Application, First Publication No. 2001-316469 are superior in heat resistance, but have high dielectric constant and high dielectric loss tangent and are also inferior in mechanical properties such as tensile strength and tensile elongation, and thus the cured articles are hard and brittle.

BRIEF SUMMARY OF THE INVENTION

An object of the present invention is to provide a polyimide resin composition comprising a polyimide resin and an epoxy resin, which has excellent heat resistance, low dielectric constant and low dielectric loss tangent and also yields a cured article having good mechanical properties such as tensile strength and tensile elongation, and a process for producing a polyimide resin used in the polyimide resin composition.

To achieve the object described above, the present inventors have intensively studied and discovered the following (a) and (b), and thus the present invention has been completed.

(a) A thermosetting polyimide resin composition comprising a polyimide resin (X), which has a carboxyl group and a linear hydrocarbon structure having a number-average molecular weight of 300 to 6,000, and an epoxy resin (Y) is superior in heat resistance and mechanical properties and can yield a cured article having good dielectric characteristics such as low dielectric constant and low dielectric loss tangent.

(b) The polyimide resin (X) can be easily produced by reacting a prepolymer (A) having an isocyanate group at the end, which is obtained by reacting a polyisocyanate compound (a1) with a polyol compound (a2) having a linear hydrocarbon structure in which a number-average molecular weight of a linear hydrocarbon structure is from 300 to 6,000, with an anhydride (B) of polycarboxylic acid having three or more carboxyl groups in an organic solvent.

The present invention provides a thermosetting polyimide resin composition comprising a polyimide resin (X), which has a carboxyl group and a linear hydrocarbon structure having a number-average molecular weight of 300 to 6,000, and an epoxy resin (Y).

Also, the present invention provides a process for producing a polyimide resin, which comprises reacting a prepolymer (A) having an isocyanate group at the end, which is obtained by reacting a polyisocyanate compound (a1) with a polyol compound (a2) having a linear hydrocarbon structure moiety in which a number-average molecular weight of a linear hydrocarbon structure is from 300 to 6,000, with an anhydride (B) of polycarboxylic acid having three or more carboxyl groups in an organic solvent.

The thermosetting polyimide resin composition of the present invention can yield a cured article having excellent heat resistance, low dielectric constant, low dielectric loss tangent and good physical properties such as tensile strength and tensile elongation. According to the process of the present invention, a polyimide resin used in the thermosetting polyimide resin composition of the present invention can be easily produced.

DETAILED DESCRIPTION OF THE INVENTION

The present invention will now be described in detail.

The polyimide resin (X) used in the present invention is preferably a polyimide resin which has a carboxyl group and a linear hydrocarbon structure having a number-average molecular weight of 300 to 6,000, and preferably polyimide resin (X1) which has a carboxyl group, a linear hydrocarbon structure having a number-average molecular weight of 700 to 4,500, a urethane bond, an imide ring, an isocyanurate ring and a cyclic aliphatic structure because it is superior in solubility in a general-purpose solvent, for example, aprotic polar organic solvent such as ketone solvent, ester solvent or ether solvent, heat resistance and mechanical properties. The linear hydrocarbon structure is particularly preferably a linear hydrocarbon structure having a number-average molecular weight of 800 to 4,200 because it gives a polyimide resin having good balance between mechanical properties and dielectric characteristics of a cured article.

The polyimide resin (X1) is a polyimide resin (X2) which has a structural unit represented by the following general formula (1) and a structural unit represented by the following general formula (2) and also has one or more kinds of end structures represented by the following general formulas (3), (4) and (5), and more preferably a polyimide resin wherein an acid value is from 20 to 250, a number-average molecular weight of a linear hydrocarbon structure moiety is from 700 to 4,500, the content of the linear hydrocarbon structure moiety is from 20 to 40% by weight, a concentration of an isocyanurate ring is from 0.3 to 1.2 mmol/g, a number-average molecular weight is from 2,000 to 30,000, and a weight-average molecular weight is from 3,000 to 100,000.

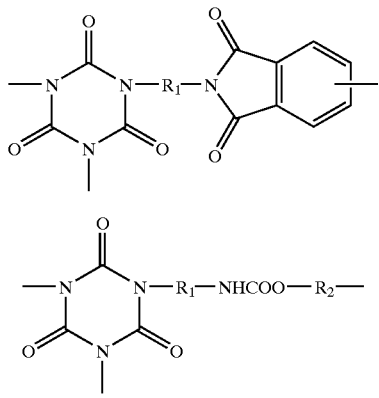

(1)

(2)

(provided that $R_1$ represents an organic group having a $C_{6-13}$ cyclic aliphatic structure and $R_2$ represents a linear hydrocarbon structure having a number-average molecular weight of 700 to 4,500, particularly preferably a linear hydrocarbon structure having a number-average molecular weight of 800 to 4,200)

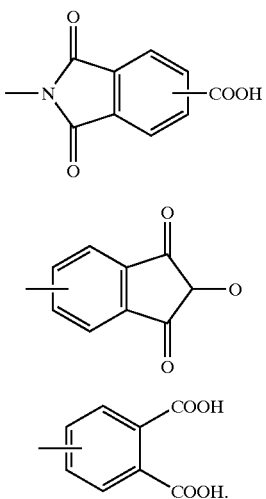

(3)

(4)

(5)

In the present invention, the acid value of the polyimide resin (X), the concentration of the isocyanurate ring, the number-average molecular weight and the weight-average molecular weight were measured by the following procedures.

(1) Acid value: The acid value is measured in accordance with JIS K-5601-2-1. As a diluent solvent of a sample, a mixed solvent of acetone and water in a volume ratio of 9:1 (acid value: 0) is used so that the acid value of an anhydrous acid can be measured.

(2) Concentration of isocyanurate ring: $^{13}$C-NMR analysis (solvent: deuterated dimethyl sulfoxide (DMSO-$d_6$)) is conducted and a concentration (mmol) of an isocyanurate ring per 1 g of a polyimide resin (X) is obtained from the spectral intensity at 149 ppm of a carbon atom attributed to the isocyanurate ring, using a calibration curve. Similarly, the concentration of an imide ring can be obtained from the spectral intensity at 169 ppm of a carbon atom attributed to the imide ring, by the $^{13}$C-NMR analysis.

(3) Number-average molecular weight and weight-average molecular weight: The number-average molecular weight and the weight-average molecular weight are determined by a gel permeation chromatography (GPC) technique (polystyrene standards).

In the case in which the polyimide resin (X) is a polyimide resin produced by the process of the present invention described hereinafter, the content of the linear hydrocarbon structure moiety in the polyimide resin (X) can be determined from the weight percentage of the polyol compound (a2) in raw materials for synthesis, while the number-average molecular weight of the linear hydrocarbon structure moiety can be determined from the number-average molecular weight of the polyol compound (a2).

Also, the content and the number-average molecular weight of the linear hydrocarbon structure moiety in the polyimide resin, the process for production of which is not known, can be determined by heat-treating a polyimide resin using a conventional process in the presence of an organic amine, thereby to decompose a urethane bond and to separate a linear hydrocarbon structure moiety from the polyimide resin, extracting the linear hydrocarbon structure moiety with a low polarity organic solvent such as dichloromethane utilizing that fact that the linear hydrocarbon structure moiety has lower polarity as compared with an imide structure moiety, and performing the measurement of the amount of the linear hydrocarbon structure moiety extracted and the GPC analysis.

The process for producing the polyimide resin used in the thermosetting polyimide resin composition of the present invention is not specifically limited and is preferably the process for producing the polyimide resin of the present invention, namely, a process comprising reacting a prepolymer (A) having an isocyanate group at the end, which is obtained by reacting a polyisocyanate compound (a1) with a polyol compound (a2) having a linear hydrocarbon structure moiety in which a number-average molecular weight of a linear hydrocarbon structure is from 300 to 6,000, with an anhydride (B) of polycarboxylic acid having three or more carboxyl groups in an organic solvent.

To produce the polyimide resin (X2) from the process of the present invention, a prepolymer having an isocyanate group at the end, which is obtained by reacting polyisocyanate having an isocyanurate ring derived from diisocyanate having a $C_{6-13}$ cyclic aliphatic structure with a polyol compound having a linear hydrocarbon structure moiety in which a number-average molecular weight of a linear hydrocarbon structure is from 700 to 4,500, may be reacted with an acid anhydride of a tricarboxylic acid in an organic solvent.

The polyisocyanate compound (a1) used in the process of the present invention is a compound having two or more isocyanate groups in the molecule and examples thereof include aromatic polyisocyanate, aliphatic polyisocyanate (including cyclic aliphatic polyisocyanate), and nurate, buret compound, adduct and allophanate compounds of these polyisocyanates.

Examples of the aromatic polyisocyanate compound include p-phenylene diisocyanate, m-phenylene diisocyanate, p-xylene diisocyanate, m-xylene diisocyanate, 2,4-tolylene diisocyanate, 2,6-tolylene diisocyanate, 4,4'-diphenylmethane diisocyanate, polymethylene polyphenyl polyisocyanate (crude MDI), polymethylene polyphenyl isocyanate, 3,3'-dimethyldiphenyl-4,4'-diisocyanate, 3,3'- diethyldiphenyl-4,4'-diisocyanate, m-xylene diisocyanate, p-xylene diisocyanate, 1,3-bis(α,α-dimethylisocyanate methyl)benzene, tetramethylxylylene diisocyanate, diphenylene ether-4,4'-diisocyanate and naphthalene diisocyanate.

Examples of the aliphatic polyisocyanate compound include hexamethylene diisocyanate, lysine diisocyanate, trimethylhexamethylene diisocyanate, isophorone diisocyanate, 4,4'-methylenebis(cyclohexyl isocyanate), 1,8-bis(isocyanatomethyl)cyclohexane and norbornene diisocyanate.

The polyisocyanate compound (a1) is preferably an aliphatic polyisocyanate because there can be obtained a polyimide resin which has good solubility in organic solvent and good compatibility with the resin or organic solvent and also yields a cured article having low dielectric constant and low dielectric loss tangent. Also, an isocyanurate type polyisocyanate is preferred because there can be obtained a polyimide resin which yields a cured article having good heat resistance.

The polyisocyanate compound (a1) is more preferably a polyisocyanate compound (a11) having an isocyanurate ring derived from an aliphatic polyisocyanate, and still more preferably a polyisocyanate compound having an isocyanurate ring derived from a cyclic aliphatic polyisocyanate, because there can be obtained a polyimide resin which has good solubility in organic solvent and good compatibility with the epoxy resin or organic solvent and also yields a cured article having low dielectric constant, low dielectric loss tangent and good heat resistance. The polyisocyanate compound having an isocyanurate ring derived from a cyclic aliphatic polyisocyanate is a polyisocyanate compound having a cyclic aliphatic structure in the amount of 2 to 3 mol, and more preferably 2.5 to 3 mol, per mol of the isocyanurate ring.

The polyisocyanate compound (a11) includes, for example, a polyisocyanate compound which is obtained by isocyanurating one, two or more kinds of aliphatic diisocyanate compounds in the presence or absence of an isocyanuration catalyst such as quaternary ammonium salt and is made of a mixture of trimer, pentamer and heptamer of isocyanurate. Specific examples of the polyisocyanate compound (a11) include isocyanurate type polyisocyanate of isophorone diisocyanate, isocyanurate type polyisocyanate of hexamethylene diisocyanate, isocyanurate type polyisocyanate of 1,4-bis(isocyanatomethyl)cyclohexane, and isocyanurate type polyisocyanate of norbornane diisocyanate.

The polyisocyanate compound (a11) is preferably a polyisocyanate compound containing a trimer of isocyanurate in the amount of 30 parts or more, and particularly preferably 50 parts by weight or more, based on 100 parts by weight of the polyisocyanate compound (a1), because there can be obtained a polyimide resin which has good solubility in organic solvent and yields a cured article having good heat resistance.

The polyisocanate compound (a11) preferably has an isocyanate group content of 10 to 30% by weight because there can be obtained a polyimide resin which has good solubility in organic solvent and yields a cured article having good heat resistance. Therefore, the polyisocyanate compound (a11) is most preferably an polyisocyanate compound having an isocyanurate ring derived from a cyclic aliphatic polyisocyanate in which the content of the isocyanate group is from 10 to 30% by weight.

The polyisocyanate having an isocyanurate ring may be used in combination with another polyisocyanate, but an isocyanurate type polyisocyanate is preferably used alone.

It is essential that the polyol compound (a2) used in the process of the present invention is a polyol compound in which the number-average molecular weight of the linear hydrocarbon structure moiety is from 300 to 6,000. A polyol compound in which the number-average molecular weight of the linear hydrocarbon structure moiety is from 700 to 4,500 is more preferred, and a polyol compound in which a number-average molecular weight of a linear hydrocarbon structure moiety is from 800 to 4,200 is particularly preferred, because there can be obtained a polyimide resin which has good solubility in organic solvent, good compatibility with the epoxy resin and organic solvent and good mechanical properties and also yields a cured article having low dielectric constant, low dielectric loss tangent and excellent film-forming properties. The polyol compound in which the number-average molecular weight of the linear hydrocarbon structure moiety is less than 300 is not preferred because the cured article exhibits high dielectric constant and high dielectric loss tangent, while the polyol compound in which the number-average molecular weight of the linear hydrocarbon structure moiety exceeds 6,000 is not preferred because the solubility in organic solvent, the compatibility with the epoxy resin and the organic solvent and mechanical properties become poor.

The polyol compound (a2) includes, for example, a compound having 1.5 or more hydroxyl groups on average per molecule, the hydroxyl groups being attached to the end and/or side chain of the linear hydrocarbon structure. The linear hydrocarbon structure may be a straight-chain or branched structure. The linear hydrocarbon structure may be a saturated hydrocarbon chain or unsaturated hydrocarbon chain structure, and more preferably a saturated hydrocarbon chain structure in view of change in physical properties and stability upon heating.

The polyol compound (a2) includes, for example, a polyol compound having a polyolefin structure or polydiene structure in which the number-average molecular weight of polyol is from 300 to 6,000, and a hydrogenated compound thereof. Examples of the olefin include ethylene, propylene, butene, isobutylene, pentene and methylpentene, and examples of the diene include pentadiene, hexadiene, pentadiene, isoprene, butadiene, propadiene and dimethylbutadiene.

Specific examples of the polyol compound (a2) include polyol compounds in which the number-average molecular weight of the linear hydrocarbon structure moiety is from 300 to 6,000, for example, polyethylene polyol, polypropylene polyol, polybutadiene polyol, hydrogenated polybutadiene polyol, polyisoprene polyol and hydrogenated polyisoprene polyol. These compounds may be used alone, or two or more kinds of them may be used in combination.

The number of the hydrogen group of the polyol compound (a2) is preferably 1.5 to 3 on average because there can be obtained a polyimide resin which is less likely to gel and exhibits good growth of molecules and also has excellent mechanical properties. The number of the hydroxyl group is particularly preferably from 1.8 to 2.2 on average.

Examples of the commercially available product of the polyol compound (a2) include liquid polybutadiene having a hydroxyl group at both ends, for example, NISSO PB (G series) manufactured by NIPPON SODA CO., LTD. and Poly-bd manufactured by IDEMITSU PETROCHEMICAL CO., LTD.; hydrogenated polybutadiene having a hydroxyl group at both ends, for example, NISSO PB (GI series) manufactured by NIPPON SODA CO., LTD., and POLYTAIL H and POLYTAIL HA manufactured by MITSUBISHI CHEMICAL CORPORATION; liquid C5 polymer having a hydroxyl group at both ends, for example, Poly-iP manufactured by IDEMITSU PETROCHEMICAL CO., LTD.; and hydrogenated polyisoprene having a hydroxyl group at both ends, for example, EPOL manufactured by IDEMITSU PETROCHEMICAL CO., LTD., and TH-1, TH-2, TH-3 manufactured by KURARAY CO., LTD.

As the polyol compound (a2), there can also be used an ester-modified polyol compound and a urethane-modified polyol compound which can be obtained by reacting the above polyol compound having a linear hydrocarbon structure with various polybasic acids and polyisocyanates.

As the polyol compound (a2), polybutadiene polyol and/or hydrogenated polybutadiene polyol are preferred and hydrogenated polybutadiene polyol is more preferred.

In the polyimide resin obtained by the process of the present invention, the linear hydrocarbon structure derived from the polyol compound (2a) is introduced into the space between rigid skeletons having an imide bond. High glass transition point is required to impart particularly excellent heat resistance to the polyimide resin obtained by the process of the present invention, and, thus it was deemed to be advantageous that the polyol compound (a2) used as raw materials has high glass transition point. As a result of intensive research, it has become apparent that the glass transition point of the cured article becomes higher as the glass transition point of the polyol compound (a2) to be introduced into the molecule of the polyimide resin becomes lower and that the cured article having more excellent mechanical properties can be obtained by using a polyol compound having a lower glass transition point. According to the above findings, the glass transition point of the polyol compound (a2) is preferably from −120 to 0° C.

In the process of the present invention, the polyol compound (a2) may be used in combination with another hydroxyl group-containing compound as long as the effects of the present invention are not impaired. The other hydroxyl group-containing compound is preferably used in an amount of 50% by weight or less based on the total hydroxyl group-containing compound.

The other hydroxyl group-containing compound may be any of a saturated polyol, an unsaturated polyol and an alcohol, and is preferably a polyol. Examples of the low-molecular weight polyol include difunctional diol such as ethylene glycol, 1,3-propylene glycol, 1,2-propylene glycol, neopentylglycol, 1,3-butanediol, 1,4-butanediol, 1,6-hexanediol, 1,9-nonanediol, 1,10-decanediol, 2,2,4-trimethyl-1,3-pentanediol, 3-methyl-1,5-pentanediol, cyclohexanedimethylol, 1,4-cyclohexanediol, tricyclodecanedimethylol, hydrogenated bisphenol A, trimethylolethane, trimethylolpropane, ditrimethylolethane, ditrimethylolpropane, glycerin, diglycerol, 3-methylpentane-1,3,5-triol, pentaerythritol, dipentaerythritol, tripentaerythritol, 2,2,6,6-tetramethylolcyclohexanol-1, mannitol, sorbitol, inositol, glucose, diethylene glycol, dipropylene glycol, dichloroneopentylglycol, dibromoneopentylglycol, neopentylglycol hydroxypivalate, spiroglycol, ethylene oxide-added bisphenol A, propylene oxide-added bisphenol A, dimethylolpropionic acid or dimethylolbutanoic acid; and tris-2-hydroxyethyl isocyanurate.

Examples of the oligomer and the high-molecular weight polyol include polyethylene polyol polymerized from cyclic ether compound, such as ethylene oxide, propylene oxide, tetrahydrofuran or butylene oxide; polyether polyol such as polypropylene polyol, polytetramethylene polyol or polybutylene polyol, and polyether polyol as a copolymer of the cyclic ether; polyester polyol synthesized from the lower-molecular weight polyol and a polybasic acid; silicone polyol such as polycarbonate polyol, urethane polyol or polydimethylsiloxane polyol; acrylic polyol; and oligomer such as epoxy polyol.

Examples of the anhydride (B) of polycarboxylic acid having three or more carboxyl groups used in the present invention include acid anhydride of tricarboxylic acid and acid anhydride of tetracarboxylic acid.

Examples of the anhydride of tricarboxylic acid include trimellitic anhydride and naphthalene-1,2,4-tricarboxylic anhydride.

Examples of the anhydride of tetracarboxylic acid include tetracarboxylic anhydrides having an aromatic organic group in the molecule, such as pyromeilitic dianhydride, benzophenone-3,4,3',4'-tetracarboxylic dianhydride, diphenyl ether-3,4,3',4'-tetracarboxylic dianhydride, benzene-1,2,3,4-tetracarboxylic dianhydride, biphenyl-3,4,3',4'-tetracarboxylic dianhydride, biphenyl-2,3,2',3'-tetracarboxylic dianhydride, naphthalene-2,3,6,7-tetracarboxylic dianhydride, naphthalene-1,2,4,5-tetracarboxylic dianhydride, naphthalene-1,8,4,5-tetracarboxylic dianhydride, decahydronaphthalene-1,8,4,5-tetracarboxylic dianhydride, 4,8-dimethyl-1,2,3,5,6,7-hexahydronaphthalene-1,2,5,6-tetracarboxylic dianhydride, 2,6-dichloronaphthalene-1,8,4,5-tetracarboxylic dianhydride, 2,7-dichloronaphthalene-1,8,4,5-tetracarboxylic dianhydride, 2,3,6,7-tetrachloronaphthalene-1,8,4,5-tetracarboxylic dianhydride, phenanthrene-1,2,9,10-tetracarboxylic dianhydride, perylene-3,4,9,10-tetracarboxylic dianhydride, bis(2,3-dicarboxyphenyl)methane dianhydride, bis(3,4-dicarboxyphenyl)methane dianhydride, 1,1-bis(2,3-dicarboxyphenyl)ethane dianhydride, 1,1-bis(3,4-dicarboxyphenyl)ethane dianhydride, 2,2-bis(2,3-dicarboxyphenyl)propane dianhydride, 2,3-bis(3,4-dicarboxyphenyl)propane dianhydride, bis(3,4-dicarboxyphenyl)sulfone dianhydride and bis(3,4-dicarboxyphenyl)ether dianhydride. These compounds can be used alone, or two or more kinds thereof can be used in combination. Also, the anhydride of tricarboxylic acid may be used in combination of the anhydride of tetracarboxylic acid.

The process for producing a polyimide resin of the present invention will now be described.

The process for producing a polyimide resin of the present invention is a process which comprises reacting a prepolymer (A) having an isocyanate group at the end, which is obtained by reacting a polyisocyanate compound (a1) with a polyol compound (a2) having a linear hydrocarbon structure moiety in which a number-average molecular weight of a linear hydrocarbon structure is from 300 to 6,000, with an anhydride (B) of polycarboxylic acid having three or more carboxyl groups in an organic solvent, and is particularly preferably a process which comprises reacting a polyisocyanate compound (a1) with a polyol compound (a2) in an organic solvent under the conditions that the content of an isocyanate group in the polyisocyanate compound (a1) is in excess relative to that of a hydroxyl group in the polyol compound (a2) to obtain a prepolymer having an isocyanate group at the end, and reacting the resulting prepolymer with an anhydride (B) of polycarboxylic acid having three or more carboxyl groups.

In the reaction between the polyisocyanate compound (a1) and the polyol compound (a2), the reaction temperature is commonly from 50 to 150° C., and preferably from 60 to 100° C. In the imidation reaction, the reaction temperature is commonly from 80 to 250° C., and preferably from 100 to 200° C.

The molar ratio of the isocyanate group in the polyisocyanate compound (a1) to the hydroxyl group in the polyol compound (a2) used in the reaction, (NCO/OH), is commonly from 1.2 to 20, and preferably from 1.5 to 10. In the reaction, various urethanization catalysts can be used.

The amount of the polyol compound (a2) is preferably from 10 to 50 parts by weight, and more preferably from 20 to 40 parts by weight, based on 100 parts by weight of the total of the polyisocyanate compound (a1), the polyol compound (a2) and the anhydride (B) of polycarboxylic acid having three or more carboxyl groups because there can be obtained a polyimide resin having good film-forming properties, good mechanical properties and good heat resistance.

In the process of the present invention, in the case in which a prepolymer (A) having an isocyanate group at the end is reacted with an anhydride (B) of polycarboxylic acid having three or more carboxyl groups in the organic solvent to obtain a polyimide resin, the molecular weight and the acid value of the resulting polyimide resin can be adjusted by changing the weight ratio of the prepolymer (A) to the acid anhydride (B). In the reaction, catalysts may be used and antioxidants and polymerization inhibitors may be used in combination.

The weight ratio of the prepolymer (A) having an isocyanate group at the end to the anhydride (B) of polycarboxylic acid having three or more carboxyl groups, (A)/(B), is commonly from 90/10 to 50/50, and preferably from 80/20 to 60/40 because there can be obtained a polyimide resin having excellent physical properties such as heat resistance and mechanical properties.

The acid value of the polyimide resin obtained by the process of the present invention is preferably from 20 to 250, and more preferably from 20 to 150 on a solid content basis in order to improve the solubility in organic solvent and the curability. With respect to the molecular weight of the polyimide resin, the number-average molecular weight is preferably from 2,000 to 30,000 and the weight-average molecular weight is preferably from 3,000 to 100,000, and the number-average molecular weight is more preferably from 2,000 to 10,000 and the weight-average molecular weight is more preferably from 3,000 to 50,000 in order to improve the solubility in solvent.

The reaction may be conducted after the organic solvent used in the process for producing a polyimide resin of the present invention is added in the system in advance, or the organic solvent used may be introduced during the reaction. Although timing and amount of the organic solvent are not specifically limited, the organic solvent is preferably added before the beginning of the reaction between the prepolymer (A) having an isocyanate group at the end and the anhydride (B) of polycarboxylic acid having three or more carboxyl groups. To maintain proper reaction rate during the reaction, the proportion of the organic solvent in the system is preferably 80% by weight or less, and more preferably from 10 to 70% by weight, based on the reaction system. Since a compound having an isocyanate group is used as a raw material component, an aprotic polar solvent, which does not have an active proton such as hydroxyl group or amino group, is preferred as the organic solvent.

Examples of the aprotic polar solvent include ether solvent, ester solvent and ketone solvent. Among these solvents, an ether solvent has weak polarity and provides an excellent reaction field in the imidation reaction between the prepolymer (A) having an isocyanate group at the end and the anhydride (B) of polycarboxylic acid having three or more carboxyl groups.

Examples of the ether solvent include ethylene glycol dialkyl ethers such as ethylene glycol dimethyl ether, ethylene glycol diethyl ether and ethylene glycol dibutyl ether; polyethylene glycol dialkyl ethers such as diethylene glycol dimethyl ether, diethylene glycol diethyl ether, diethylene glycol dibutyl ether, triethylene glycol dimethyl ether, triethylene glycol diethyl ether and triethylene glycol dibutyl ether; ethylene glycol monoalkyl ether acetates such as ethylene glycol monomethyl ether acetate, ethylene glycol monoethyl ether acetate and ethylene glycol monobutyl ether acetate; polyethylene glycol monoalkyl ether acetates such as diethylene glycol monomethyl ether acetate, diethylene glycol monoethyl ether acetate, diethylene glycol monobutyl ether acetate, triethylene glycol monomethyl ether acetate, triethylene glycol monoethyl ether acetate and triethylene glycol monobutyl ether acetate; propylene glycol dialkyl ethers such as propylene glycol dimethyl ether, propylene glycol diethyl ether and propylene glycol dibutyl ether; polypropylene glycol dialkyl ethers such as dipropylene glycol dimethyl ether, dipropylene glycol diethyl ether, dipropylene glycol dibutyl ether, tripropylene glycol dimethyl ether, tripropylene glycol diethyl ether and tripropylene glycol dibutyl ether; propylene glycol monoalkyl ether acetates such as propylene glycol monomethyl ether acetate, propylene glycol mono ethyl ether acetate and propylene glycol monobutyl ether acetate; polypropylene glycol monoalkyl ether acetates such as dipropylene glycol monomethyl ether acetate, dipropylene glycol monoethyl ether acetate, dipropylene glycol monobutyl ether acetate, tripropylene glycol monomethyl ether acetate, tripropylene glycol mono ethyl ether acetate and, tripropylene glycol monobutyl ether acetate; dialkyl ether of copolymerized polyether glycol, such as low-molecular weight ethylene-propylene copolymer; monoacetate monoalkyl ether of copolymerized polyether glycol; alkyl ester of copolymerized polyether glycol; and monoalkyl ester monoalkyl ether of copolymerized polyether glycol.

Examples of the ester solvent include ethyl acetate and butyl acetate. Examples of the ketone solvent include acetone, methyl ethyl ketone and cyclohexanone. Also, these solvents can be used in combination with polar solvents such as dimethylformamide, dimethylacetamide, N-methyl-2-pyrrolidone, dimethyl sulfoxide, sulfolane and γ-butyrolactone.

The thermosetting polyimide resin composition of the present invention will now be described in detail.

The thermosetting polyimide resin composition of the present invention is a resin compound which comprises the polyimide resin (X) and the epoxy resin (Y) as an essential component and further comprises a compound (Z) having two or more phenolic hydroxyl groups, if necessary.

Examples of the epoxy resin (Y) include bisphenol epoxy resins such as bisphenol A epoxy resin, bisphenol S epoxy resin and bisphenol F epoxy resin; novolak epoxy resins such as phenol novolak epoxy resin, cresol novolak epoxy resin and bisphenol novolak resin; epoxidated compounds of various dicyclopentadiene-modified phenol resins obtained by reacting dicyclopentadiene with various phenols; biphenyl epoxy resins such as epoxidated compound of 2,2',6,6'-tetramethylbiphenol; epoxy resin having a naphthalene skeleton; aromatic epoxy resins such as epoxy resin having a fluorene skeleton, and hydrogenated compounds of these aromatic epoxy resins; aliphatic epoxy resins such as neopentyl glycol diglycidyl ether and 1,6-hexanediol diglycidyl ether; alicylic epoxy resins such as 3,4-epoxycyclohexylmethyl-3,4-epoxycyclohexane carboxylate and bis-(3,4-epoxycyclohexyl)adipate; and heterocyclecontaining epoxy resins such as triglycidyl isocyanurate. Among these resins, aromatic epoxy resins are preferred because a thermosetting polyimide resin composition having excellent heat resistance can be obtained.

With respect to the mixing ratio of the polyimide resin (X) to the epoxy resin (Y), a weight ratio or the polyimide resin (X) to the epoxy resin (Y), (X)/(Y), is preferably within a range from 1 to 10, and more preferably from 1 to 5. The molar ratio of the carboxyl group (x) in the polyimide resin (X) to the epoxy group (y) in the epoxy resin (Y), (x)/(y), is preferably from 0.7 to 1.3.

In the thermosetting polyimide resin composition of the present invention, a compound (Z) having two or more phenolic hydroxyl groups is preferably used in combination in order to control the crosslink density upon curing of the polyimide resin (X) and the epoxy resin (Y). The crosslink density in the polyimide resin (X) and the epoxy resin (Y) can be enhanced by using in combination with the compound (Z) having two or more phenolic hydroxyl groups, thereby making it possible to reduce the linear expansion coefficient at a temperature higher than the glass transition point. To enhance the crosslink density and to reduce the linear expansion coefficient, the mixing ratio of the polyimide resin (X), the epoxy resin (Y) and the compound (Z) having two or more phenolic hydroxyl groups in the thermosetting polyimide resin composition is preferably as follows: the content of the polyimide resin (X) is from 40 to 85% by weight, the content of the epoxy resin (Y) is from 10 to 40% by weight and the content of the compound (Z) having two or more phenolic hydroxyl groups is from 5 to 20% by weight based on 100% by weight of the total of them. The molar ratio of the total of the carboxyl group (x) in the polyimide resin (X) to the hydroxyl group (z) in the compound (Z) having two or more phenolic hydroxyl groups to the epoxy group (y) in the epoxy resin (Y), (x+z)/(y), is preferably from 0.7 to 1.3.

Examples of the compound (Z) having two or more phenolic hydroxyl groups include bisphenol compounds such as bisphenol A, bisphenol F and bisphenol S; novolak resins such as phenol novolak resin, cresol novolak resin, bisphenol novolak resin, phenolsalicyl aldehyde novolak resin and terpene diphenol novolak resin; biphenol compounds such as biphenol, biphenol novolak, tetramethylbiphenol and derivatives thereof; and fluorene compounds such as phenol fluorene and cresol fluorene. Among these compounds, a compound having three or more phenolic hydroxyl groups are preferred because a thermosetting polyimide resin composition having excellent heat resistance can be obtained.

If necessary, the thermosetting polyimide resin composition of the present invention can be used in combination with other curing agents and curing accelerators and examples thereof include melamine, dicyandiamide, guanamine and derivative thereof, amines, phenols having a hydroxyl group, organic phosphines, phosphonium salts, quaternary ammonium salts, polybasic anhydride, photo-cation catalyst, cyanate compound, isocyanate compound and block isocyanate compound.

If necessary, various fillers, organic pigments, inorganic pigments, extender pigment and rust preventives can be added to the thermosetting polyimide resin composition of the present invention. These additives may be used alone, or two or more kinds of them may be used in combination.

Examples of the filler include barium sulfate, barium titanate, silicon oxide powder, finegranular silicon oxide, silica, talc, clay, magnesium carbonate, calcium carbonate, aluminum oxide, aluminum hydroxide and mica.

Examples of the organic pigment include azo pigments; copper phthalocyanine pigments such as phthalocyanine blue and phthalocyanine green; and quinacridone pigments.

Examples of the inorganic powder include chromates such as chrome yellow, zinc chromate and molybdate orange; ferrocyanide such as Prussian blue, titanium oxide, zinc oxide, red iron oxide, iron oxide; metal oxide such as chromium green carbide, cadmium yellow, cadmium red; metal sulfide such as mercury sulfide, selenide; sulfate such as lead sulfate; silicate such as ultramarine blue; carbonate, cobalt violet; phosphate such as manganese violet; metal powders such as aluminum powder, zinc powder, brass powder, magnesium powder, iron powder, copper powder and nickel powder; and carbon black.

In addition, other coloring pigments, rust preventive pigments and extender pigments can be used. These pigments may be used alone, or two or more kinds of them may be used.

The thermosetting polyimide resin composition of the present invention is commonly applied by the desired process such as cast, impregnation or coating. The curing temperature is from 80 to 300° C. and the curing time is from 20 minutes to 5 hours.

EXAMPLES

The present invention will now be described in more detail by way of Examples and Comparative Examples. In the following Examples and Comparative Examples, parts and percentages are by weight unless otherwise specified.

Example 1

In a 20 liter flask equipped with a stirrer, a thermometer and a condenser, 4951 g of diethylene glycol monoethyl ether acetate (hereinafter abbreviated to EDGA), 2760 g (12 mol in terms of isocyanate group) of polyisocyanate having an isocyanurate ring derived from isophorone diisocyanate (hereinafter abbreviated to IPDI-N, isocyanate group content: 18.2%, isocyanurate ring-containing triisocyanate content: 85%) and 2191 g (2 mol in term of hydroxyl group) of POLYTAIL HA (hydrogenated liquid polybutadiene having a hydroxyl group at both ends, manufactured by MITSUBISHI CHEMICAL CORPORATION, number-average molecular weight: 2,100, hydroxyl value: 51.2 mg KOH/g) were charged and, after heating to 80° C. with stirring while monitoring heat generation, the mixture was reacted for 3 hours. 1536 g of EDGA and 1536 g (8 mol) of trimellitic anhydride (hereinafter abbreviated to TMA) were further charged and, after heating to 160° C., the mixture was reacted for 4 hours. The reaction proceeded while foaming. In the system, a polyimide resin solution was obtained as a clear pale brown liquid.

The resulting polyimide resin solution was applied on a KBr plate and, after volatilizing the solvent in a sample, an infrared absorption spectrum of the sample was measured. As a result, a characteristic absorption at 2270 $cm^{-1}$ of the isocyanate group completely disappeared and it was confirmed that the infrared absorption spectrum shows absorptions of the imide ring at 725 $cm^{-1}$, 1780 $cm^{-1}$ and 1720 $cm^{-1}$, characteristic absorptions of the isocyanurate ring at 1690 $cm^{-1}$ and 1460 $cm^{-1}$, and a characteristic absorption of the urethane bond at 1550 $cm^{-1}$. The acid value of the polyimide resin was 79 mg KOH/g on a solid content basis, the concentration of the isocyanurate ring was 0.66 mmol/g (on a resin solid content basis), the number-average molecular weight (hereinafter abbreviated to Mn) was 5,900, and the weight-average molecular weight (hereinafter abbreviated to Mw) was 24,000. Hereinafter, this polyimide resin solution is abbreviated to (X-1).

Example 2

In a 20 liter flask equipped with a stirrer, a thermometer and a condenser, 4300 g of EDGA, 2070 g (9 mol in terms of isocyanate group) of IPDI-N and 550 g (3 mol in terms of isocyanate group) of polyisocyanate having an isocyanurate ring derived from 1,6-hexane diisocyanate (isocyanate group content: 22.9%, isocyanurate ring-containing triisocyanate content: 63.3%) were charged, followed by uniform mixing and further addition of 2191 g (2 mol in terms of hydroxyl group) of POLYTAIL HA. After heating to 80° C. with stirring while monitoring heat generation, the mixture was reacted for 3 hours. 1536 g (8 mol) of TMA was added and, after heating to 160° C., the mixture was reacted for 4 hours. The reaction proceeded while foaming and 2000 g of EDGA was further added when the viscosity increased, and thus it became difficult to stir the reaction solution in the system. In the system, a polyimide resin solution was obtained as a clear pale brown liquid.

Using the resulting polyimide resin solution, an infrared absorption spectrum was measured in the same manner as in Example 1. As a result, a characteristic absorption at 2270 $cm^{-1}$ of the isocyanate group completely disappeared and it was confirmed that the infrared absorption spectrum shows absorptions of the imide ring at 725 $cm^{-1}$, 1780 $cm^{-1}$ and 1720 $cm^{-1}$, characteristic absorptions of the isocyanurate ring at 1690 $cm^{-1}$ and 1460 $cm^{-1}$, and a characteristic absorption of the urethane bond at 1550 $cm^{-1}$. The acid value of the polyimide resin was 85 mg KOH/g on a solid content basis, the concentration of the isocyanurate ring was 0.68 mmol/g, Mn was 5,500, and Mw was 22,000. Hereinafter, this polyimide resin solution is abbreviated to (X-2).

Example 3

In a 20 liter flask equipped with a stirrer, a thermometer and a condenser, 5310 g of EDGA, 1380 g (6 mol in terms of isocyanate group) of IPDI-N and 1344 g (6 mol in terms of isocyanate group) of polyisocyanate having an isocyanurate ring derived from norvornene diisocyanate (isocyanate group content: 18.75%, isocyanurate ring-containing triisocyanate content: 65.5%) were charged and, after dissolving at 80° C. with heating, 2191 g (2 mol in terms of hydroxyl group) of POLYTAIL HA was further charged and the mixture was reacted at 80° C. with stirring for 5 hours. 1536 g (8 mol) of TMA was further added and, after heating to 170° C., the mixture was reacted for 4 hours. In the system, a polyimide resin solution was obtained as a clear pale brown liquid.

Using the resulting polyimide resin solution, an infrared absorption spectrum was measured in the same manner as in Example 1. As a result, a characteristic absorption at 2270 $cm^{-1}$ of the isocyanate group completely disappeared and it was confirmed that the infrared absorption spectrum shows absorptions of the imide ring at 725 $cm^{-1}$, 1780 $cm^{-1}$ and 1720 $cm^{-1}$, characteristic absorptions of the isocyanurate ring at 1690 $cm^{-1}$ and 1460 $cm^{-1}$, and a characteristic absorption of the urethane bond at 1550 $cm^{-1}$. The acid value of the polyimide resin was 75 mg KOH/g on a solid content basis, the concentration of the isocyanurate ring was 0.72 mmol/g, Mn was 4,400, and Mw was 21,000. Hereinafter, this polyimide resin solution is abbreviated to (X-3).

Example 4

In a 20 liter flask equipped with a stirrer, a thermometer and a condenser, 5636 g of EDGA, 2760 g (12 mol in terms of isocyanate group) of IPDI-N and 2876 g (2 mol in terms of hydroxyl group) of NISSO-PB G-3000 (liquid polybutadiene having an hydroxyl group at both ends, manufactured by NIPPON SODA CO., LTD., number-average molecular weight: 2,800, hydroxyl value: 39) were charged and, after heating to 80° C. while monitoring heat generation, the mixture was reacted for 3 hours. 1537 g of EDGA and 1536 g (8 mol) of TMA were further charged and, after heating to 160° C., the mixture was reacted for 4 hours. The reaction proceeded while foaming. In the system, a polyimide resin solution was obtained as a clear pale brown liquid.

Using the resulting polyimide resin solution, an infrared absorption spectrum was measured in the same manner as in Example 1. As a result, a characteristic absorption at 2270 $cm^{-1}$ of the isocyanate group completely disappeared and it was confirmed that the infrared absorption spectrum shows absorptions of the imide ring at 725 $cm^{-1}$, 1780 $cm^{-1}$ and 1720 $cm^{-1}$, characteristic absorptions of the isocyanurate ring at 1690 $cm^{-1}$ and 1460 $cm^{-1}$, and a characteristic absorption of the urethane bond at 1550 $cm^{-1}$. The acid value of the polyimide resin was 70 mg KOH/g on a solid content basis, the concentration of the isocyanurate ring was 0.59 mmol/g, Mn was 5,400, and Mw was 32,000. Hereinafter, this polyimide resin solution is abbreviated to (X-4).

Example 5

In a 20 liter flask equipped with a stirrer, a thermometer and a condenser, 5712 g of EDGA, 2760 g (12 mol in terms of isocyanate group) of IPDI-N and 2952 g (1.47 mol in terms of hydroxyl group) of NISSO-PB GI-3000 (hydrogenated liquid polybutadiene having an hydroxyl group at both ends, manufactured by NIPPON SODA CO., LTD., number-average molecular weight: 4,000, hydroxyl value: 28) were charged and, after heating to 80° C. while monitoring heat generation, the mixture was reacted for 3 hours. 1728 g of EDGA and 1728 g (9 mol) of TMA were further charged and, after heating to 160° C., the mixture was reacted for 4 hours. The reaction proceeded while foaming. In the system, a polyimide resin solution was obtained as a clear pale brown liquid.

Using the resulting polyimide resin solution, an infrared absorption spectrum was measured in the same manner as in Example 1. As a result, a characteristic absorption at 2270 $cm^{-1}$ of the isocyanate group completely disappeared and it was confirmed that the infrared absorption spectrum shows absorptions of the imide ring at 725 $cm^{-1}$, 1780 $cm^{-1}$ and 1720 $cm^{-1}$, characteristic absorptions of the isocyanurate ring at 1690 $cm^{-1}$ and 1460 $cm^{-1}$, and a characteristic absorption of the urethane bond at 1550 $cm^{-1}$. The acid value of the polyimide resin was 74 mg KOH/g on a solid content basis, the concentration of the isocyanurate ring was 0.57 mmol/g, Mn was 3,600, and Mw was 24,000. Hereinafter, this polyimide resin solution is abbreviated to (X-5).

Example 6

In a 20 liter flask equipped with a stirrer, a thermometer and a condenser, 5284 g of EDGA, 2760 g (12 mol in terms of isocyanate group) of IPDI-N, 524 g (4 mol in terms of isocyanate group) of 4,4'-dicyclohexylmethane diisocyanate (hydrogenated diphenylmethane diisocyanate (hydrogenated MDI), hereinafter abbreviated to H12MDI) and 2000 g (2 mol in terms of hydroxyl group) of TH-21 (hydrogenated polyisoprene having a hydroxyl group at both ends, manufactured by KURARAY CO., LTD., number-average molecular weight: 2,600, hydroxyl value: 56.1) were charged and, after heating to 80° C. while monitoring heat generation, the mixture was reacted for 3 hours. 1536 g of EDGA and 1536 g (8 mol) of TMA were further charged and, after heating to 160° C., the mixture was reacted for 4 hours. The reaction proceeded while foaming. In the system, a polyimide resin solution was obtained as a clear pale brown liquid.

Using the resulting polyimide resin solution, an infrared absorption spectrum was measured in the same manner as in Example 1. As a result, a characteristic absorption at 2270 $cm^{-1}$ of the isocyanate group completely disappeared and it was confirmed that the infrared absorption spectrum shows absorptions of the imide ring at 725 $cm^{-1}$, 1780 $cm^{-1}$ and 1720 $cm^{-1}$, characteristic absorptions of the isocyanurate ring at 1690 $cm^{-1}$ and 1460 $cm^{-1}$, and a characteristic absorption of the urethane bond at 1550 $cm^{-1}$. The acid value of the polyimide resin was 72 mg KOH/g on a solid content basis, the concentration of the isocyanurate ring was 0.64 mmol/g, Mn was 5,100, and Mw was 23,000. Hereinafter, this polyimide resin solution is abbreviated to (X-6).

Example 7

In a 20 liter flask equipped with a stirrer, a thermometer and a condenser, 5451 g of EDGA, 2760 g (12 mol in terms of isocyanate group) of IPDI-N, 500 g (2 mol in terms of isocyanate group) of diphenylmethane diisocyanate and 2191 g (2 mol in terms of hydroxyl group) of POLYTAIL HA were charged and, after heating to 80° C. while monitoring heat generation, the mixture was reacted for 3 hours. 1536 g of EDGA, 1344 g (7 mol) of TMA and 218 g (1 mol) of pyromellitic anhydride were further charged and, after heating to 160° C., the mixture was reacted for 4 hours. The reaction proceeded while foaming. In the system, a polyimide resin solution was obtained as a clear pale brown liquid.

Using the resulting polyimide resin solution, an infrared absorption spectrum was measured in the same manner as in Example 1. As a result, a characteristic absorption at 2270 $cm^{-1}$ of the isocyanate group completely disappeared and it was confirmed that the infrared absorption spectrum shows absorptions of the imide ring at 725 $cm^{-1}$, 1780 $cm^{-1}$ and 1720 $cm^{-1}$, characteristic absorptions of the isocyanurate ring at 1690 $cm^{-1}$ and 1460 $cm^{-1}$, and a characteristic absorption of the urethane bond at 1550 $cm^{-1}$. The acid value of the polyimide resin was 73 mg KOH/g on a solid content basis, the concentration of the isocyanurate ring was 0.63 mmol/g, Mn was 5,600, and Mw was 32,000. Hereinafter, this polyimide resin solution is abbreviated to (X-7).

Example 8

In a 20 liter flask equipped with a stirrer, a thermometer and a condenser, 5020 g of EDGA, 2220 g (isocyanate group content: 37.8%) of isophorone diisocyanate and 2191 g (2 mol in terms of hydroxyl group) of POLYTAIL HA were charged and, after heating to 80° C. while monitoring heat generation, the mixture was reacted for 3 hours. 960 g (5 mol) of TMA was further charged and, after heating to 160° C., the mixture was reacted for 4 hours. The reaction proceeded while foaming. In the system, a polyimide resin solution was obtained as a clear pale brown liquid.

Using the resulting polyimide resin solution, an infrared absorption spectrum was measured in the same manner as in Example 1. As a result, a characteristic absorption at 2270 $cm^{-1}$ of the isocyanate group completely disappeared and it was confirmed that the infrared absorption spectrum shows absorptions of the imide ring at 725 $cm^{-1}$, 1780 $cm^{-1}$ and 1720 $cm^{-1}$ and a characteristic absorption of the urethane bond at 1550 $cm^{-1}$. The acid value of the polyimide resin was 53 mg KOH/g on a solid content basis, the concentration of the isocyanurate ring was 0 mmol/g, Mn was 4,100, and Mw was 12,500. Hereinafter, this polyimide resin solution is abbreviated to (X-8).

Comparative Example 1

In a 10 liter flask equipped with a stirrer, a thermometer and a condenser, 1496 g of dimethylformamide, 888 g (8 mol in terms of isocyanate group) of isophorone diisocyanate and 960 g (5 mol) of TMA were charged and, after heating to 160° C., the mixture was reacted for 4 hours. The reaction proceeded while foaming. In the system, a polyimide resin solution was obtained as a clear pale brown liquid.

Using the resulting polyimide resin solution, an infrared absorption spectrum was measured in the same manner as in Example 1. As a result, a characteristic absorption at 2270 $cm^{-1}$ of the isocyanate group completely disappeared and it was confirmed that the infrared absorption spectrum shows absorptions of the imide ring at 725 $cm^{-1}$, 1780 $cm^{-1}$ and 1720 $cm^{-1}$. The acid value of the polyimide resin was 94 mg KOH/g on a solid content basis, Mn was 770, and Mw was 2,500. Hereinafter, this polyimide resin solution is abbreviated to (X-1').

Comparative Example 2

In a 10 liter flask equipped with a stirrer, a thermometer and a condenser, 1496 g of EDGA, 2760 g (12 mol in terms of isocyanate group) of IPDI-N and 1728 g (9 mol in terms of hydroxyl group) of TMA were charged and, after heating to 150° C., the mixture was reacted for 8 hours. The reaction proceeded while foaming. In the system, a polyimide resin solution was obtained as a clear pale brown liquid.

Using the resulting polyimide resin solution, an infrared absorption spectrum was measured in the same manner as in Example 1. As a result, a characteristic absorption at 2270 $cm^{-1}$ of the isocyanate group completely disappeared and it was confirmed that the infrared absorption spectrum shows absorptions of the imide ring at 725 $cm^{-1}$, 1780 $cm^{-1}$ and 1720 $cm^{-1}$, characteristic absorptions of the isocyanurate ring at 1690 $cm^{-1}$ and 1460 $cm^{-1}$, and a characteristic absorption of the urethane bond at 1550 $cm^{-1}$. The acid value of the polyimide resin was 95 mg KOH/g on a solid content basis, the concentration of the isocyanurate ring was 0.64 mmol/g, Mn was 4,100, and Mw was 12,000. Hereinafter, this polyimide resin solution is abbreviated to (X-2').

Examples 9 to 21 and Comparative Examples 3 to 4

In accordance with the formulations shown in Table 1 to Table 2, the thermosetting polyimide resin compositions No. 1 to No. 13 of the present invention and comparative thermosetting polyimide resin compositions No. 1' to No. 2' were prepared. To all of these resin compositions, 1 part of triphenylphosphine was added as a curing catalyst. The numerical values in Table 1 to Table 2 show the resin solid content (parts by weight).

TABLE 1

| Items | | Examples | | | | | | | |
|---|---|---|---|---|---|---|---|---|---|
| | | 9 | 10 | 11 | 12 | 13 | 14 | 15 | 16 |
| Resin composition No. | | 1 | 2 | 3 | 4 | 5 | 6 | 7 | 8 |
| Polyimide resin (X) (Resin solid content) (Parts) | X-1 | 70 | | | | | | | |
| | X-2 | | 70 | | | | | | |
| | X-3 | | | 75 | | | | | |
| | X-4 | | | | 75 | | | | |
| | X-5 | | | | | 75 | | | |
| | X-6 | | | | | | 75 | | |
| | X-7 | | | | | | | 75 | |
| | X-8 | | | | | | | | 75 |
| Epoxy resin (Y) (Parts) | N680 | 30 | 30 | 25 | 25 | 25 | 25 | 25 | 25 |

TABLE 2

| Items | | Examples | | | | | Comparative Examples | |
|---|---|---|---|---|---|---|---|---|
| | | 17 | 18 | 19 | 20 | 21 | 3 | 4 |
| Resin composition No. | | 9 | 10 | 11 | 12 | 13 | 1' | 2' |
| Polyimide resin (X) (Resin solid content) (Parts) | X-1 | 70 | | | | | | |
| | X-2 | | 40 | | | | | |
| | X-3 | | | 75 | | | | |
| | X-5 | | | | 55 | | | |
| | X-6 | | | | | 65 | | |
| | X-1' | | | | | | 75 | |
| | X-2' | | | | | | | 70 |
| Epoxy resin (Y) (Parts) | N680 | | | | | 30 | 25 | 30 |
| | HP7200 | 30 | 45 | | 30 | | | |
| | EXA4700 | | | 25 | | | | |
| Compound (Z) (Parts) | TD2090 | | 15 | | 15 | | 5 | |

Notes for Table 1 to Table 2
N680: cresol novolak epoxy resin, EPICLON N-680 (softening point: 80° C., epoxy equivalent weight: 213 g/eq), manufactured by Dainippon Ink and Chemicals, Inc.
HP7200: dicyclopentadiene-modified epoxy resin, EPICLON HP-7200, manufactured by Dainippon Ink and Chemicals, Inc.
EXA4700: polyfunctional naphthalene novolak epoxy resin, epoxy equivalent weight: 264 g/eq
EPICLON EXA-4700, manufactured by Dainippon Ink and Chemicals, Inc, epoxy equivalent weight: 163 g/eq
TD2090: phenol novolak resin, PHENOLITE TD-2090 (softening point: 120° C., hydroxyl group equivalent weight: 105 g/eq), manufactured by Dainippon Ink and Chemicals, Inc.

Test Examples 1 to 13 and Comparative Test Examples 1 to 2

Using the thermosetting polyimide resin compositions No. 1 to No. 13 of the present invention and the comparative thermosetting polyimide resin compositions No. 1' to No. 2', a test for compatibility, a test for coating film-forming properties, measurement of glass transition point (Tg), a tensile test, a pressure cooker test (PCT), a test for soldering heat resistance and a measurement of dielectric characteristics were conducted by the following procedures. The results are shown in Table 3 to Table 5.

(1) Test for Compatibility

The compatible state of the thermosetting polyimide resin compositions No. 1 to No. 13 and the comparative thermosetting polyimide resin compositions No. 1' to No. 2' prepared in accordance with the formulations shown in Table 1 to Table 2, and the state of the coating film obtained by applying each of the resulting resin compositions on a glass plate and drying at 120° C. were evaluated according to the following evaluation criteria.

Evaluation Criteria

◎: The uniform composition was easily prepared by stirring the components, and foreign matter was not observed on the surface of the coating film.

○: The uniform composition was easily prepared by stirring the components, and foreign matter was not observed on the surface of the coating film.

Δ: The uniform composition was not easily prepared by stirring the components, and small amounts of foreign matter were observed on the surface of the coating film.

X: The components did not easily dissolve and cissing, foreign matter and insoluble matter were observed on the surface of the coating film.

(2) Test for Coating Film-forming Properties

Each of test pieces obtained by applying the thermosetting polyimide resin composition on a tin plate in a dry film thickness of 30 μm and drying at 110° C. for 30 minutes was allowed to stand at room temperature for 24 hours. The appearance of the coating film was evaluated according to the following evaluation criteria.

Evaluation Criteria

○: Abnormality such as cracking was not observed on the coating

Δ: Slight cracking was observed on the coating film.

X: Cracking occurred on the entire surface of the coating film.

(3) Measurement of Glass Transition Point (Tg)

<Production of Test Piece>

Two kinds of cured coating films were produced by applying the thermosetting polyimide resin composition on a tin plate in a cured film thickness of 50 μm, drying at 120° C. for 20 minutes and curing at 150° C. for one hour or 170° C. for one hour. After cooling to room temperature, the resulting cured coating films were cut from the coated plates and used as test pieces for measurement of Tg.

<Procedure for Measurement of Tg>

Using the test pieces for measurement of Tg, the dynamic viscoelasticity was measured under the following conditions and the temperature of maximum tan δ of the resulting spectrum was taken as Tg.

Measuring apparatus: viscoelasticity measuring apparatus RSA-II, manufactured by Rheometric Science Jig: jig for stretching Initial grip separation: 20 mm Measuring temperature: 25 to 300° C.

Measuring frequency: 1 Hz

Heating rate: 3° C./min (4) Tensile Test

<Production of Test Piece>

The thermosetting polyimide resin composition was applied on a tin plate in a cured film thickness of 50 μm. The coated plate was dried using a dryer at 120° C. for 20 minutes and then cured at 170° C. for one hour to produce two levels of cured coating films. After cooling to room temperature, the cured films were cut into a predetermined size and separated from the plate to obtain test pieces.

<Procedure for Measurement of Tensile Characteristics>

Five test pieces produced by curing at 170° C. for one hour in the same manner as in the case of the test specimen for measurement of Tg. Then, the tensile test was conducted under the following conditions and the tensile strength and the elongation at break were determined.

Measuring apparatus: TENSILON, manufactured by TOYO BALDWIN CO., LTD.
Size of test specimen: 10 mm×70 mm
Initial grip separation: 20 mm
Crosshead speed: 10 mm/min
Measuring atmosphere: 22° C., 45% RH (5) Pressure Cooker Test (PCT)

The thermosetting polyimide resin composition was applied on a glass epoxy print board on which a copper circuit pattern was formed in a cured film thickness of 50 μm. Test pieces were produced by drying the coated board at 120° C. for 20 minutes and curing at 170° C. for one hour. After treating in a pressure cooker testing machine (PC-304RIII, manufactured by Hirayama Manufacturing Corporation) at 121° C. and 100% RH (under saturated vapor pressure) for 50 hours, the temperature was returned to room temperature and a change in appearance was visually evaluated according to the following evaluation criteria. Each coating film on the test pieces was cross-cut at intervals of 1 mm to form cross-cuts, and then a cellophane tape was adhered on the cross-cut surface and peeled off. The number of the cross-cuts peeled off was counted and the adhesion of the coating film was evaluated.

(i) Evaluation Criteria for Appearance

⊚: Neither change nor abnormality was not observed before and after the test.
○: After the test, abnormality of the coating film, such as blistering, whitening or dissolution was observed within an area of less than 5% relative to the entire area of the coating film.
Δ: After the test, abnormality of the coating film, such as blistering, whitening or dissolution was observed within an area of 5 to 30% relative to the entire area of the coating film.
X: After the test, abnormality of the coating film, such as blistering, whitening or dissolution was observed within an area of 30% or more relative to the entire area of the coating film.

(ii) Evaluation Criteria for Adhesion

⊚: no peeling of cross-cuts of the coating film
○: the number of cross-cuts peeled off was less than 20 based on 100 cross-cuts of the coating film
Δ: the number of cross-cuts peeled off was from 20 to 70 based on 100 cross-cuts of the coating film
X: the number of cross-cuts peeled off was 70 or more based on 100 cross-cuts of the coating film (6) Test for Soldering Heat Resistance Each of test pieces obtained by cutting the test pieces in the same manner as in the case of the pressure cooker test into a size of 25×25 mm was floated on a molten solder bath at 260° C. for 10 seconds while facing the surface of the coating film downward (1 cycle) and, after repeating 3 cycles, defects such as blistering of the coating film and the adhesion were evaluated according to the following criteria.

Evaluation Criteria

⊚: No change was observed before and after the test.
○: After the test, defects and peeling were observed within an area of less than 5% relative to the entire area of the coating film.
Δ: After the test, defects and peeling were observed within an area of 5 to 30% relative to the entire area of the coating film.
X: After the test, defects and peeling were observed within an area of 30% or more relative to the entire area of the coating film.

(7) Measurement of Dielectric Characteristics

Each of the test pieces obtained by applying the thermosetting polyimide resin composition on a tin plate in a cured film thickness of 200 μm, drying using a dryer at 120° C. for 20 minutes, curing at 150° C. for one hour, cooling and cutting the peeled cured coating film was subjected to the measurement of the frequency at 1 GHz and the measurement of the dielectric constant (∈) and the dielectric loss (tan δ) using 4291B, manufactured by Agilent Technologies.

TABLE 3

|  |  | Test Examples | | | | |
| --- | --- | --- | --- | --- | --- | --- |
| Items |  | 1 | 2 | 3 | 4 | 5 |
| Resin composition No. |  | 1 | 2 | 3 | 4 | 5 |
| Compatibility |  | ⊚ | ⊚ | ⊚ | ⊚ | ⊚ |
| Coating film-forming properties |  | ○ | ○ | ○ | ○ | ○ |
| Tg | Curing at 150° C. (° C.) | 230 | 210 | 235 | 190 | 205 |
|  | Curing at 170° C. (° C.) | 235 | 210 | 237 | 195 | 205 |
| Tensile | Tensile strength (MPa) | 73 | 76 | 82 | 87 | 71 |
| test | Elongation at break (%) | 15 | 11 | 12 | 14 | 13 |
| PCT | Appearance | ⊚ | ⊚ | ⊚ | ⊚ | ⊚ |
|  | Adhesion | ⊚ | ⊚ | ⊚ | ⊚ | ⊚ |
| Soldering heat resistance |  | ⊚ | ⊚ | ⊚ | ⊚ | ⊚ |
| Dielectric | ∈ | 2.91 | 2.94 | 2.90 | 2.80 | 2.85 |
| characteristics | tan δ | 0.010 | 0.011 | 0.010 | 0.009 | 0.009 |

TABLE 4

|  |  | Test Examples | | | | |
| --- | --- | --- | --- | --- | --- | --- |
| Items |  | 6 | 7 | 8 | 9 | 10 |
| Resin composition No. |  | 6 | 7 | 8 | 9 | 10 |
| Compatibility |  | ⊚ | ⊚ | ⊚ | ⊚ | ⊚ |
| Coating film-forming properties |  | ○ | ○ | ○ | ○ | ○ |
| Tg | Curing at 150° C. (° C.) | 220 | 200 | 175 | 235 | 190 |
|  | Curing at 170° C. (° C.) | 235 | 210 | 185 | 245 | 193 |

TABLE 4-continued

|  |  | Test Examples | | | | |
|---|---|---|---|---|---|---|
| Items | | 6 | 7 | 8 | 9 | 10 |
| Tensile test | Tensile strength (MPa) | 75 | 91 | 75 | 80 | 91 |
|  | Elongation at break (%) | 10 | 8 | 8 | 10 | 8 |
| PCT | Appearance | ⊚ | ⊚ | ○ | ⊚ | ⊚ |
|  | Adhesion | ⊚ | ⊚ | ○ | ⊚ | ⊚ |
| Soldering heat resistance | | ⊚ | ⊚ | ○ | ⊚ | ⊚ |
| Dielectric characteristics | ε | 2.90 | 2.99 | 3.05 | 2.87 | 3.05 |
|  | tan δ | 0.010 | 0.012 | 0.014 | 0.009 | 0.012 |

TABLE 5

|  |  | Test Examples | | | Comparative Test Examples | |
|---|---|---|---|---|---|---|
| Items | | 11 | 12 | 13 | 1 | 2 |
| Resin composition No. | | 11 | 12 | 13 | 1' | 2' |
| Compatibility | | ⊚ | ⊚ | ⊚ | ⊚ | ⊚ |
| Coating film-forming properties | | ○ | ○ | ○ | X | X |
| Tg | Curing at 150° C. (° C.) | 240 | 195 | 215 | 163 | 230 |
|  | Curing at 170° C. (° C.) | 250 | 205 | 220 | 170 | 270 |
| Tensile test | Tensile strength (MPa) | 92 | 88 | 87 | 72 | 81 |
|  | Elongation at break (%) | 9 | 9 | 9 | 3 | 9 |
| PCT | Appearance | ⊚ | ⊚ | ⊚ | ○ | ⊚ |
|  | Adhesion | ⊚ | ⊚ | ⊚ | X | Δ |
| Soldering heat resistance | | ⊚ | ⊚ | ⊚ | ○ | ⊚ |
| Dielectric characteristics | ε | 2.91 | 3.01 | 3.00 | 4.12 | 3.35 |
|  | tan δ | 0.010 | 0.011 | 0.010 | 0.036 | 0.025 |

As is apparent from the results of Table 3 to Table 5, the cured coating films of the thermosetting polyimide resin compositions of the Examples exhibit very high Tg and these thermosetting polyimide resin composition are deemed to be materials capable of exhibiting good heat resistance even at high temperature. Furthermore, these thermosetting polyimide resin compositions have such a feature that they have good dielectric characteristics such as low dielectric constant and low dielectric loss tangent while maintaining high Tg and also exhibit good mechanical properties such as large elongation. Also, these compositions have very high resistance in the PCT test and the soldering heat resistance test.

In contrast, the cured coating film made of the thermosetting polyimide resin composition of Comparative Test Example 1 exhibited low Tg as compared with the cured coating films of the Examples and also exhibited inferior results in the breaking elongation, PCT resistance, soldering heat resistance, dielectric constant and dielectric loss tangent. Also, the cured coating film made of the thermosetting polyimide resin composition of Comparative Test Example 2 exhibited very high Tg, but exhibited inferior results in the PCT resistance (adhesion), dielectric constant and dielectric loss tangent as compared with the cured coating films of the Examples.

What is claimed is:

1. A thermosetting polyimide resin composition comprising a polyimide resin (X), which has a carboxyl group and a linear hydrocarbon structure having a number-average molecular weight of 300 to 6,000, a urethane bond, an imide ring, an isocyanurate ring, and a cyclic aliphatic structure, and an epoxy resin (Y).

2. The thermosetting polyimide resin composition according to claim 1, wherein said number-average molecular weight is 700 to 4,500.

3. The thermosetting polyimide resin composition according to claim 2, wherein the polyimide resin (X) is a polyimide resin which has a structural unit represented by the following general formula (1) and a structural unit represented by the following general formula (2) and also has one or more kinds of the end structures represented by the following general formulas (3), (4) and (5)

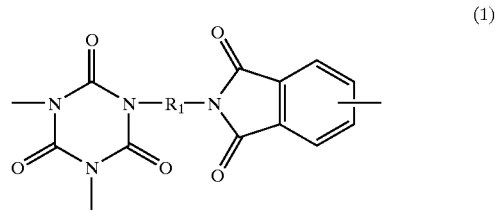

(1)

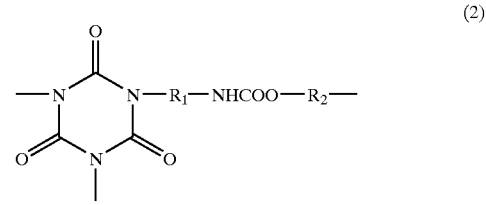

(2)

provided that $R_1$ represents an organic group having a $C_{6-13}$ cyclic aliphatic structure and $R_2$ represents a linear hydrocarbon structure having a number-average molecular weight of 700 to 4,500

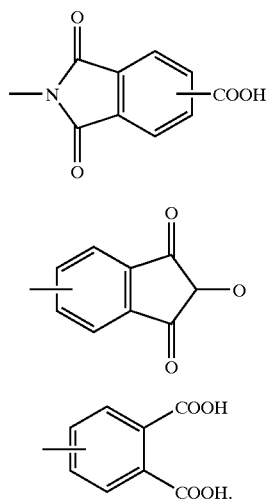

4. The thermosetting polyimide resin composition according to claim 3, wherein the polyimide resin (X) is a polyimide resin in which an acid value is from 20 to 250, a number-average molecular weight of a linear hydrocarbon structure moiety is from 700 to 4,500, the content of the linear hydrocarbon structure moiety is from 20 to 40% by weight, a concentration of an isocyanurate ring is from 0.3 to 1.2 mmol/g, a number-average molecular weight is from 2,000 to 30,000, and a weight-average molecular weight is from 3,000 to 100,000.

5. The thermosetting polyimide resin composition according to claim 1, wherein the polyimide resin (X) is a polyimide resin obtained by reacting a prepolymer (A) having an isocyanate group at the end, which is obtained by reacting a polyisocyanate compound (a1) with a polyol compound (a2) having a linear hydrocarbon structure in which a number-average molecular weight of a linear hydrocarbon structure is from 300 to 6,000, with an anhydride (B) of polycarboxylic acid having three or more carboxyl groups in an organic solvent.

6. The thermosetting polyimide resin composition according to claim 5, wherein the polyimide resin (X) is a polyimide resin obtained by using polyisocyanate having an isocyanurate ring derived from a cyclic aliphatic diisocyanate as the polyisocyanate compound (a1) and using polyol having 1.5 to 3 hydroxyl groups on average in which a number-average molecular weight of a linear hydrocarbon structure moiety is from 700 to 4,500 as the polyol compound (a2) in an amount of 20 to 40 parts by weight based on 100 parts by weight of the total of the polyisocyanate compound (a1), the polyol compound (a2) and the anhydride (B) of polycarboxylic acid having three or more carboxyl groups.

7. The thermosetting polyimide resin composition according to any one of claims 1–5 or 6, wherein the polyimide resin (X) is a polyimide resin having an acid value of 20 to 250 and a weight ratio of the polyimide resin (X) to the epoxy resin (Y), (X)/(Y), is from 1 to 10.

8. The thermosetting polyimide resin composition according to any one of claims 1–5 or 6, which further comprises a compound (Z) having two or more phenolic hydroxyl groups.

9. The thermosetting polyimide resin composition according to claim 8, wherein the content of the polyimide resin (X) is from 40 to 85% by weight, the content of the epoxy resin (Y) is from 10 to 40% by weight and the content of the compound (Z) having two or more phenolic hydroxyl groups is from 5 to 20% by weight based on 100% by weight of the total of the polyimide resin (X), the epoxy resin (Y) and the compound (Z) having two or more phenolic hydroxyl groups.

10. A process for producing a polyimide resin, which comprises reacting a prepolymer having an isocyanate group at the end, which is obtained by reacting a polyisocyanate compound (a11) having an isocyanurate ring derived from an aliphatic polyisocyanate with a polyol compound (a2) having a linear hydrocarbon structure in which a number-average molecular weight of a linear hydrocarbon structure moiety is from 300 to 6,000, with an anhydride (B) of polycarboxylic acid having three or more carboxyl groups in an organic solvent.

11. The process for producing a polyimide resin according to claim 10, wherein the polyol compound (a2) is polyol having 1.5 to 3 hydroxyl groups on average in which a number-average molecular weight of a linear hydrocarbon structure moiety is from 700 to 4,500.

12. The process for producing a polyimide resin according to claim 10, wherein the polyol compound (a2) is used in an amount of 20 to 40 parts by weight based on 100 parts by weight of the total of the polyisocyanate (a11) having an isocyanurate ring derived from an aliphatic polyisocyanate, the polyols compound (a2), and the anhydride (B) of polycarboxylic acid having three or more carboxyl groups.

13. The process for producing a polyimide resin according to claim 10, wherein the anhydride (B) of polycarboxylic acid having three or more carboxyl groups is an anhydride of tricarboxylic acid.

14. The process for producing a polyimide resin according to any one of claims 10–12 or 13, wherein the polyisocyanate compound (a11) having an isocyanurate ring derived from an aliphatic polyisocyanate is polyisocyanate having an isocyanurate ring derived from an aliphatic diisocyanate.

15. The process for producing a polyimide resin according to any one of claims 10–12 or 13, wherein the polyisocyanate compound (a11) having an isocyanurate ring derived from an aliphatic polyisocyanate is polyisocyanate having an isocyanurate ring derived from a cyclic aliphatic polyisocyanate in which the content of the isocyanate group is from 10 to 30% by weight.

16. The process for producing a polyimide resin according to claim 14, wherein the organic solvent is an ether solvent.

17. A polyimide resin, which is obtained by reacting a prepolymer having an isocyanate group at the end, which is obtained by reacting a polyisocyanate compound having an isocyanurate ring derived from a cyclic aliphatic polyisocyanate with a polyols compound having a linear hydrocarbon structure in which a number-average molecular weight of a linear hydrocarbon structure moiety is from 700 to 4,500, with an anhydride (B) of polycarboxylic acid having three or more carboxyl groups in an organic solvent, wherein an acid value is from 20 to 250, the content of the linear hydrocarbon structure is from 20 to 40% by weight, a concentration of an isocyanurate ring is from 0.3 to 1.2 mmol/g, a number-average molecular weigh is from 2,000 to 30,000, and a weight average molecular weight is from 3,000 to 100,000.

18. The polyimide resin according to claim 17, wherein the anhydride (B) of polycarboxylic acid having three or more carboxyl groups is an anhydride of tricarboxylic acid.

19. The polyimide resin according to any of claims 17 or 18, wherein the polyisocyanate compound having an isocyanurate ring derived from a cyclic aliphatic polyisocyanate is polyisocyanate having an isocyanurate ring derived from diisocyanate having a $C_{6-13}$ cyclic aliphatic structure.

20. A polyimide resin having a structure unit represented by the following general formula (1) and a structural unit represented by the following general formula (2) and also has one or more kinds of the end structures represented by the following general formulas (3), (4) and (5), wherein an acid value is from 20 to 250, the content of a linear hydrocarbon structure is from 20 to 40% by weight, a concentration of an isocyanurate ring is from 0.3 to 1.2 mmol/g, a number-average molecular weight is from 2,000 to 30,000, a weight-average molecular weight is from 3,000 to 100,000, provided that $R_1$ represents an organic group having a $C_{6-13}$ cyclic aliphatic structure and $R_2$ represents a linear hydrocarbon structure having a number-average molecular weight of 700 to 4,500

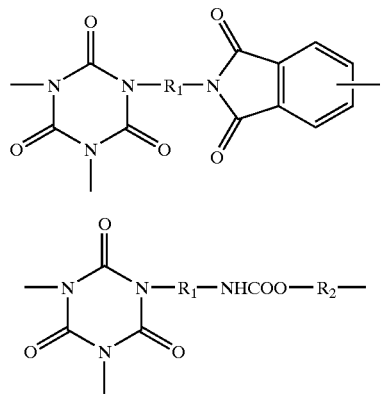

(1)

(2)

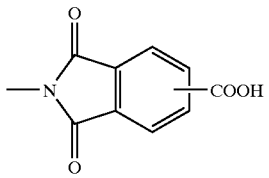

(3)

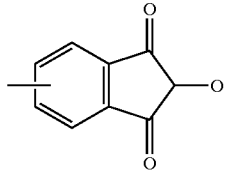

(4)

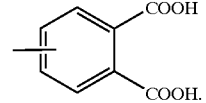

(5)

* * * * *